(12) United States Patent
Backus, Jr. et al.

(10) Patent No.: US 9,455,703 B2
(45) Date of Patent: Sep. 27, 2016

(54) FET ARRAY BYPASS MODULE

(71) Applicant: EAGLEPICHER TECHNOLOGIES, LLC, Joplin, MO (US)

(72) Inventors: David Paul Backus, Jr., Carthage, MO (US); David Brown, Joplin, MO (US)

(73) Assignee: EAGLEPICHER TECHNOLOGIES, LLC, Joplin, MO (US)

( * ) Notice: Subject to any disclaimer, the term of this patent is extended or adjusted under 35 U.S.C. 154(b) by 0 days.

(21) Appl. No.: 14/538,196

(22) Filed: Nov. 11, 2014

(65) Prior Publication Data
US 2015/0137873 A1 May 21, 2015

Related U.S. Application Data

(60) Provisional application No. 61/904,798, filed on Nov. 15, 2013.

(51) Int. Cl.
| | | |
|---|---|---|
| H03K 17/00 | (2006.01) | |
| H03K 17/687 | (2006.01) | |
| H03K 17/08 | (2006.01) | |
| H03K 17/12 | (2006.01) | |
| H02J 7/00 | (2006.01) | |
| H02J 9/00 | (2006.01) | |

(52) U.S. Cl.
CPC ......... *H03K 17/6872* (2013.01); *H02J 7/0029* (2013.01); *H02J 7/0047* (2013.01); *H02J 7/0052* (2013.01); *H02J 7/0065* (2013.01); *H02J 9/002* (2013.01); *H03K 17/08* (2013.01); *H03K 17/122* (2013.01); *H02J 2007/0039* (2013.01)

(58) Field of Classification Search
USPC .................................................. 327/365–508
See application file for complete search history.

(56) References Cited

U.S. PATENT DOCUMENTS

| | | | | | |
|---|---|---|---|---|---|
| 5,274,272 | A | * | 12/1993 | Schwarzinger | H02J 7/022 327/113 |
| 5,337,277 | A | * | 8/1994 | Jang | G11C 29/808 365/200 |
| 5,481,228 | A | * | 1/1996 | Badyal | H03B 5/366 327/175 |
| 6,034,506 | A | * | 3/2000 | Hall | H02J 7/0019 320/101 |
| 6,327,211 | B1 | * | 12/2001 | Kai | G11C 16/06 365/189.15 |
| 7,379,358 | B2 | * | 5/2008 | Park | G11C 29/812 365/200 |
| 7,750,667 | B2 | * | 7/2010 | Jung | H03K 19/0013 326/31 |
| 2004/0047215 | A1 | * | 3/2004 | Kim | G11C 7/065 365/205 |
| 2006/0028861 | A1 | * | 2/2006 | Han | G11C 11/412 365/154 |
| 2012/0044014 | A1 | * | 2/2012 | Stratakos | H02J 3/383 327/530 |
| 2013/0321054 | A1 | * | 12/2013 | Gasper | H03H 11/265 327/281 |
| 2014/0103985 | A1 | * | 4/2014 | Andreev | H03K 5/131 327/262 |

\* cited by examiner

*Primary Examiner* — Brandon S Cole
(74) *Attorney, Agent, or Firm* — Kenealy Vaidya LLP

(57) ABSTRACT

A bypass module including a plurality of P-Channel MOSFETs connected in parallel to form a P-Channel MOSFET array, a plurality of N-Channel MOSFETs connected in parallel to form a N-Channel MOSFET array, and a control module to control switching of the P-Channel MOSFET array and the N-Channel MOSFET array is disclosed. A battery or load management device used to switch higher current and low voltages is disclosed. A battery bypass and bypass method for charge, discharge, and charge limiting control for various types of batteries is disclosed.

20 Claims, 6 Drawing Sheets

FET ARRAY BYPASS MODULE

CROSS-REFERENCE TO RELATED APPLICATION

This application claims the benefit of U.S. Provisional Application No. 61/904,798, filed Nov. 15, 2013. The application is incorporated herein by reference in its entirety.

TECHNICAL FIELD

Some embodiments generally relate to battery or load management devices that may be used to switch higher current and low voltages. Example embodiments also relate to battery bypass for charge, discharge, and charge limiting control for various types of batteries.

BACKGROUND

A bypass element is provided for safeguarding electro-chemical battery cells or groups of several parallel-connected battery cells, which are connected together in series to form a battery, at least one bypass element being connected in parallel with each respective series-connected battery cell or each respective group of battery cells, the bypass element bypassing the circuit of the cell when a predetermined charging capacity of the battery cells is reached.

SUMMARY

An electro-mechanical contactor may be used as a bypass element. However, electro-mechanical contactors are expensive and occupy a large amount of space. In addition, the use of contactors to switch each path of the current causes long delays to account for contact bounce. Contactor coil drive current is typically maintained at a very high level to assure activation of the coils and proper force to perform the switching. Moreover, the contactor in its switched state draws more coil current thereby drawing more power from the system. Even larger coil currents are drawn during switch transition.

Switching of power systems from one source of energy to another frequently causes unwanted interruptions to the operation of electronic equipment. The duration of this outage is sufficient to cause loss of volatile data and frequently resets the operation of complex electrical machines. Power switching is often required for the rotation of equipment during maintenance or recovery from equipment failures.

The speed of operation of an electro-mechanical contactor is dependent on its construction, temperature, position, and the voltage applied to the coil. It is not advisable for several contactors to be interconnected for the purpose of switching power without allowing sufficient "dead time" between them to eliminate overlap.

Accordingly, a continuing need exists for a system to switch medium/high currents quickly without shorting the two paths during the switch transition. A continuing need also exists for a system which eliminates the need to use heavy and expensive electro-mechanical contactors. A continuing need also exists for eliminating the increased power draw from the system during switching. A methodology to perform this switching while maintaining guaranteed isolation, utilizing less power and even switching faster than the current state of the art would benefit many supply and battery switching systems.

Embodiments of the disclosure provide numerous technical effects and unobvious solutions over conventional methods. For example, the designs, methods, and devices described in this disclosure may provide a safe switching logic that may rapidly allow the switch to toggle without allowing both virtual poles to be connected together without bounce or costly microprocessors.

Example embodiments provide a solid-state implementation of a single pole double throw (SPDT) or Form C contactor functionality. Example embodiments also provide a solid-state short-circuit prevention using break-before-make (BBM) switching with uninterrupted conduction in at least one direction, for example. Example embodiments also provide a bypass for power sources or loads of various sizes. Example embodiments also provide derivation of MOSFET gate (device drive) voltage directly from the power source with almost no quiescent current, for example.

Example embodiments disclosed may be used to switch large electrochemical energy storage elements to allow for primary and backup energy sources in a given system. Example embodiments disclosed may also be used for switching of high current DC loads to allow one energy source to be used in more than one way. Cascading of the switches in a star or branched topology in one or more example embodiments may allow any source to provide a signal or power to any load in a large system. Cascading of the switches in a modular series topology in one or more example embodiments may allow for high voltage sources and loads to be switched in or out in a large system.

Example embodiments provide an improved bypass module to switch higher currents and low voltages. Bypass modules in accordance with some embodiments are generally characterized by reduced risk of shorting, reduced power draw from the bypass module during switching, enhanced scalability to any source or load switching application, and enhanced efficiency compared to conventional electro-mechanical contactors. It should be appreciated that the above examples of technical effects and/or solutions of the example embodiments are merely illustrative and that numerous other technical effects and/or solutions may exist.

In an exemplary embodiment, a solid state semiconductor circuit is provided to switch higher current and low voltages. In an embodiment, the solid state semiconductor circuit may act as a Form C Contactor composed of two metal-oxide-semiconductor field-effect transistor (MOSFET) type switches. The MOSFET switches may control two circuits: one normally-open contact and one normally-closed contact with a common terminal. In another embodiment, the solid state semiconductor circuit may additionally have circuitry employed to drive the MOSFET gates to avoid shorting, and to control the normally-open and normally-closed functions.

In an embodiment, the solid state semiconductor circuit may allow for granular module bypassing which provides the ability to disable a bad subcomponent of the solid state semiconductor circuit. In an embodiment, the MOSFET gate voltage may be taken directly from the module, allowing a true normally-closed contact in the off-state to dissipate no power for gate drive.

There are various refinements of the features noted in relation to the above-mentioned aspects. Further features may also be incorporated in the above-mentioned aspects. The above aspects, refinements, and additional features may exist individually or in any combination. For instance, various features discussed below in relation to any of the illustrated embodiments may be incorporated into any of the above-described aspects of the example embodiments, alone or in any combination thereof.

BRIEF DESCRIPTION OF THE DRAWINGS

Various exemplary embodiments of a bypass module to which aspects of the invention are applied will be described in detail with reference to the following drawings in which.

Skilled artisans will appreciate that elements in the figures are illustrated for simplicity and clarity and have not necessarily been drawn to scale. For example, the dimensions of some of the elements in the circuit schematic may be exaggerated relative to other elements to help improve understanding of the example embodiments.

DETAILED DESCRIPTION OF THE EMBODIMENTS

The following description and the drawings sufficiently illustrate specific embodiments to enable those skilled in the art to practice them. Other embodiments may incorporate structural, logical, electrical, process, and other changes. Portions and features of some embodiments may be included in, or substituted for, those of other embodiments. Embodiments set forth in the claims encompass all available equivalents of those claims.

Figure 1:
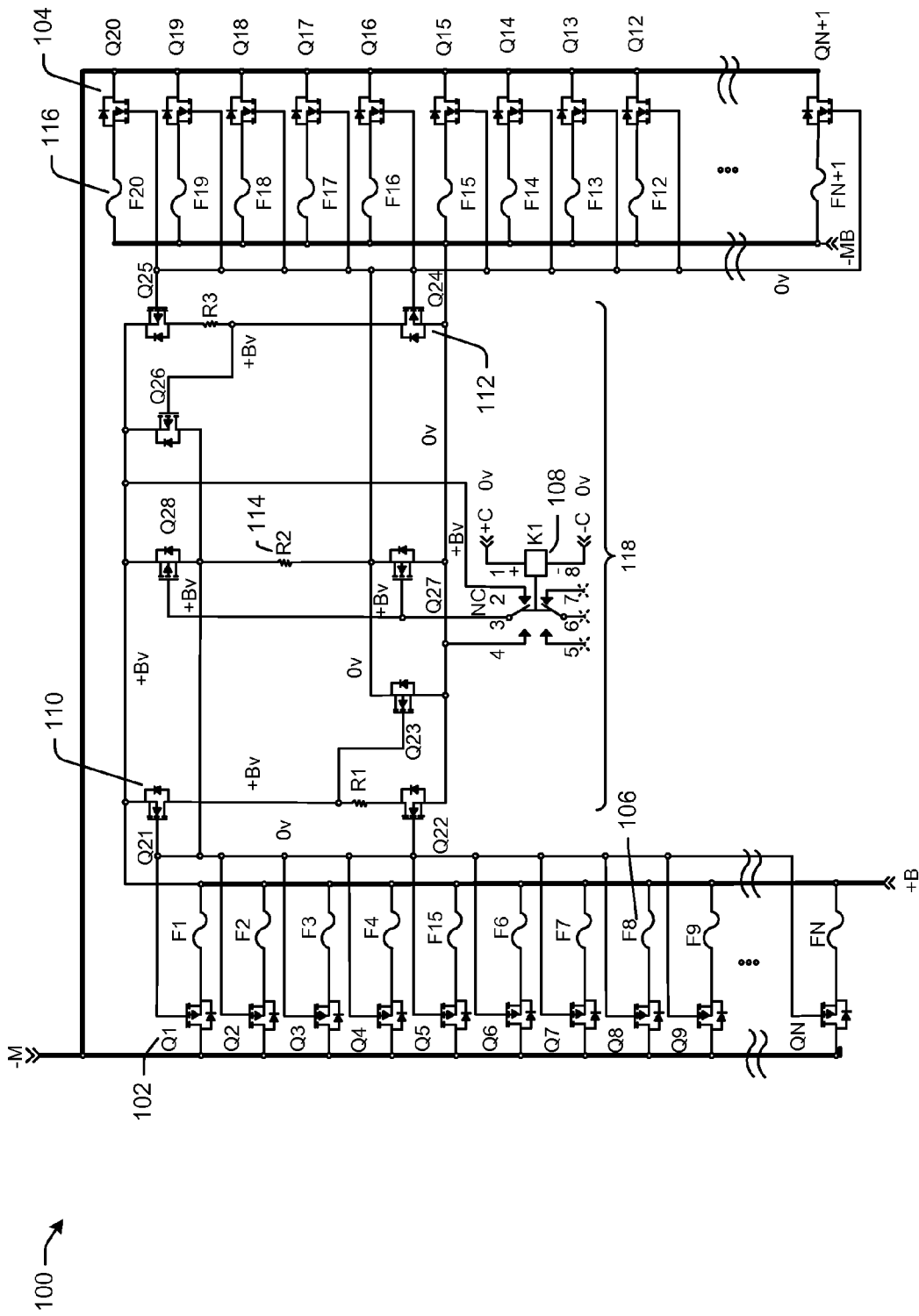
FIG. 1 is a schematic of a solid state semiconductor circuit according to one or more example embodiments.

Turning now to FIG. 1, FIG. 1 shows a schematic of a solid state semiconductor circuit 100, according to one or more example embodiments. The solid state semiconductor circuit 100 may be a field-effect transistor (FET) bypass module 100 to switch high current and low voltages, for example. A low voltage as described herein may refer to any voltage less than about 50V, for example. A medium or mid-range voltage as described herein may refer to any voltage between 50V and 500V, for example. A high voltage as described herein may refer to any voltage greater than about 500V, for example. Similarly, a low current as described herein may refer to any current less than about 1 A, for example. A medium or mid-range current as described herein may refer to any current between 1 A and 50 A, for example. A high current as described herein may refer to any current greater than about 50 A, for example.

In this example embodiment, the solid state semiconductor circuit or FET bypass module 100 may act as a Form C Contactor composed of two or more MOSFET type switches. As shown in FIG. 1, a plurality of N-Channel metal-oxide-semiconductor field-effect transistors (MOSFETs) 104 may act as one side of the Form C Contactor and a plurality of P-Channel metal-oxide-semiconductor field-effect transistors (MOSFETs) 102 may act as an opposite side of the Form C Contactor. As illustrated in FIG. 1, the plurality of P-Channel MOSFETs may be connected in parallel (Q1, Q2, Q3, Q4, Q5, Q6, Q7, Q8, Q9, . . . QN) to form a P-Channel MOSFET array, for example, and the plurality of N-Channel MOSFETs (QN+1, Q12, Q13, Q14, Q15, Q16, Q17, Q18, Q19, Q20) may be connected in parallel to form a N-Channel MOSFET array, for example.

A control module 118 may be used to control switching of the P-Channel MOSFET array and the N-Channel MOSFET array. In one or more example embodiments, the plurality of P-Channel MOSFETs 102 may function as normally closed (NC) switches, and the plurality of N-Channel MOSFETs 104 may function as normally open (NO) switches. The control module 118 may include one or more N-Channel logic level enhancement mode FETs 112 (Q22, Q23, Q24, Q27) and one or more P-Channel logic level enhancement mode FETs or switch resisters 110 (Q21, Q25, Q26, Q28) to toggle between the P-Channel MOSFET array and the N-Channel MOSFET array. The control module 118 may include a signal relay (K1) 108 that may activate the anti-shorting circuit or control module 118 which controls the two MOSFET arrays. The relay 108 may be a double pole double throw (DPDT) relay, for example, which may have two rows of change-over terminals. Equivalent to two single pole double throw (SPDT) switches or relays actuated by a single coil, such a relay may have eight terminals, including the coil, for example. In one embodiment, the relay may be a single pole double throw (SPDT) relay, which may have one row of change-over terminals, for example. Such a relay may have five terminals, including the coil, for example.

In one example embodiment, the FET bypass module 100 may wait for the circuit connection to break in plurality of MOSFETs 102 before making a connection with the circuit in the other plurality of MOSFETs 104. For example, the control module 118 may receive one or more control signals from a control signals interface to control switching of the P-Channel MOSFET array and the N-Channel MOSFET array so both arrays do not conduct at the same time. Each of the plurality of P-Channel MOSFETs 102 and the plurality of N-Channel MOSFETs 104 may be connected in series to one or more fuses 106, 116 (F1, F2, F3, F4, F5, F6, F7, F8, F9, FN, FN+1, F12, F13, F14, F15, F16, F17, F18, F19, F20) to which the load or source may attach. The fuses may be 15 A or any size suitable for the purpose, for example. The control module 118 may further include one or more resistors 114 (R1, R2, R3) to limit a current entering or exiting the one or more N-Channel logic level enhancement mode FETs 112 or the one or more P-Channel logic level enhancement mode FETs 110.

Figure 2:
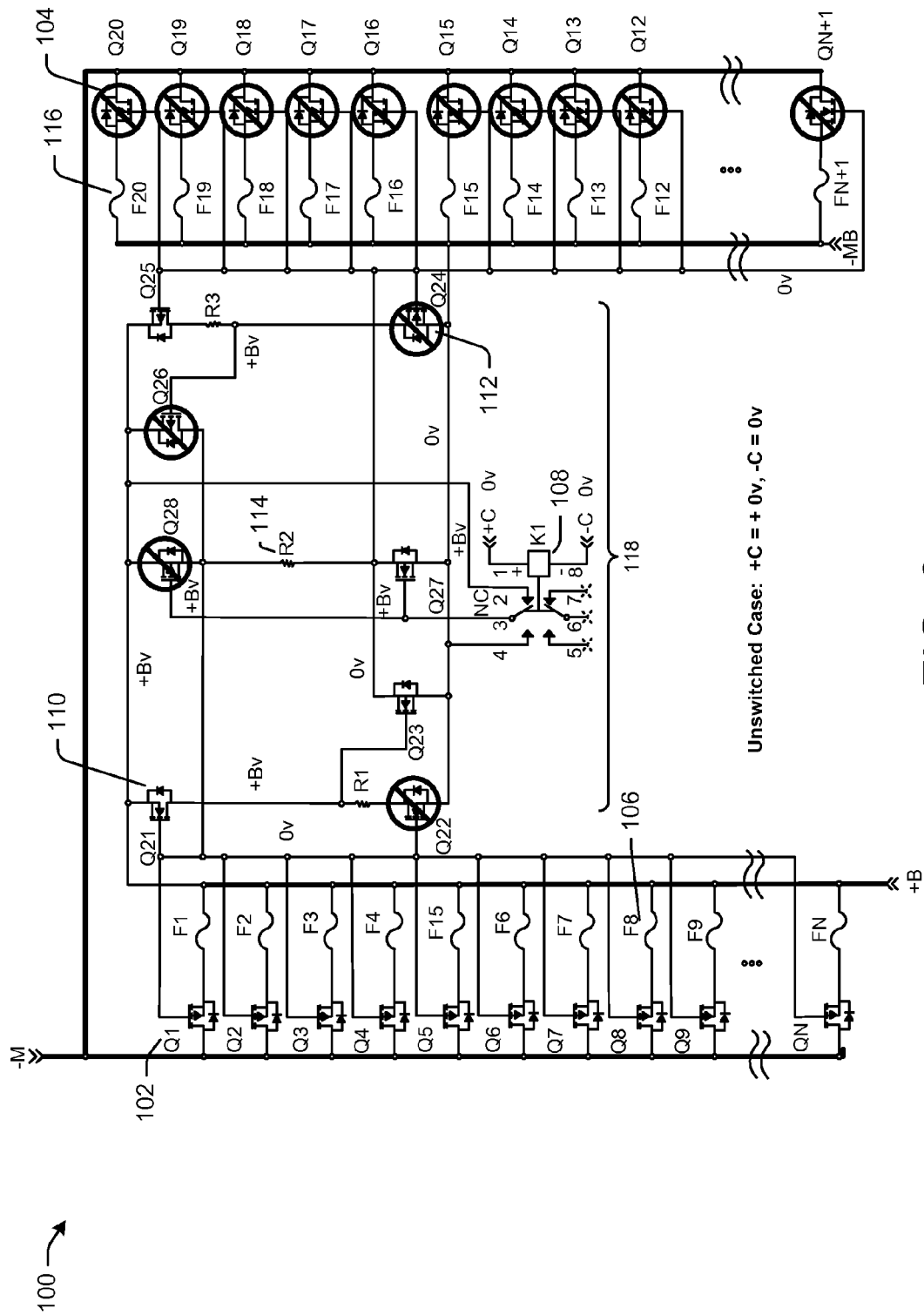
FIG. 2 is a schematic of a solid state semiconductor circuit according to one or more example embodiments.

Turning now to FIG. 2, FIG. 2 illustrates an unswitched state of the solid state semiconductor circuit or FET bypass module 100, according to one or more example embodiments. As illustrated in the figure, the control module 118 receives a 0V input in an unswitched state, and so the normally closed (NC) P-Channel MOSFETs 102 may remain in a closed mode, thereby allowing current to pass through, and the normally open (NO) N-Channel MOSFETs 104 may remain in an open mode, thereby blocking any current to pass through. In this state, the control module 118, which comprises the primary drivers of gate voltages (Q21-Q28), may receive a 0V input from the relay K1 and so the N-Channel logic level enhancement mode FETs (Q22, Q24) and the P-Channel logic level enhancement mode FETs (Q26, Q28) may be in an open mode, thereby blocking any current to pass through, and the N-Channel logic level enhancement mode FETs (Q23, Q27) and the P-Channel logic level enhancement mode FETs (Q21, Q25) may be in an closed mode, thereby allowing current to pass through.

Figure 3:
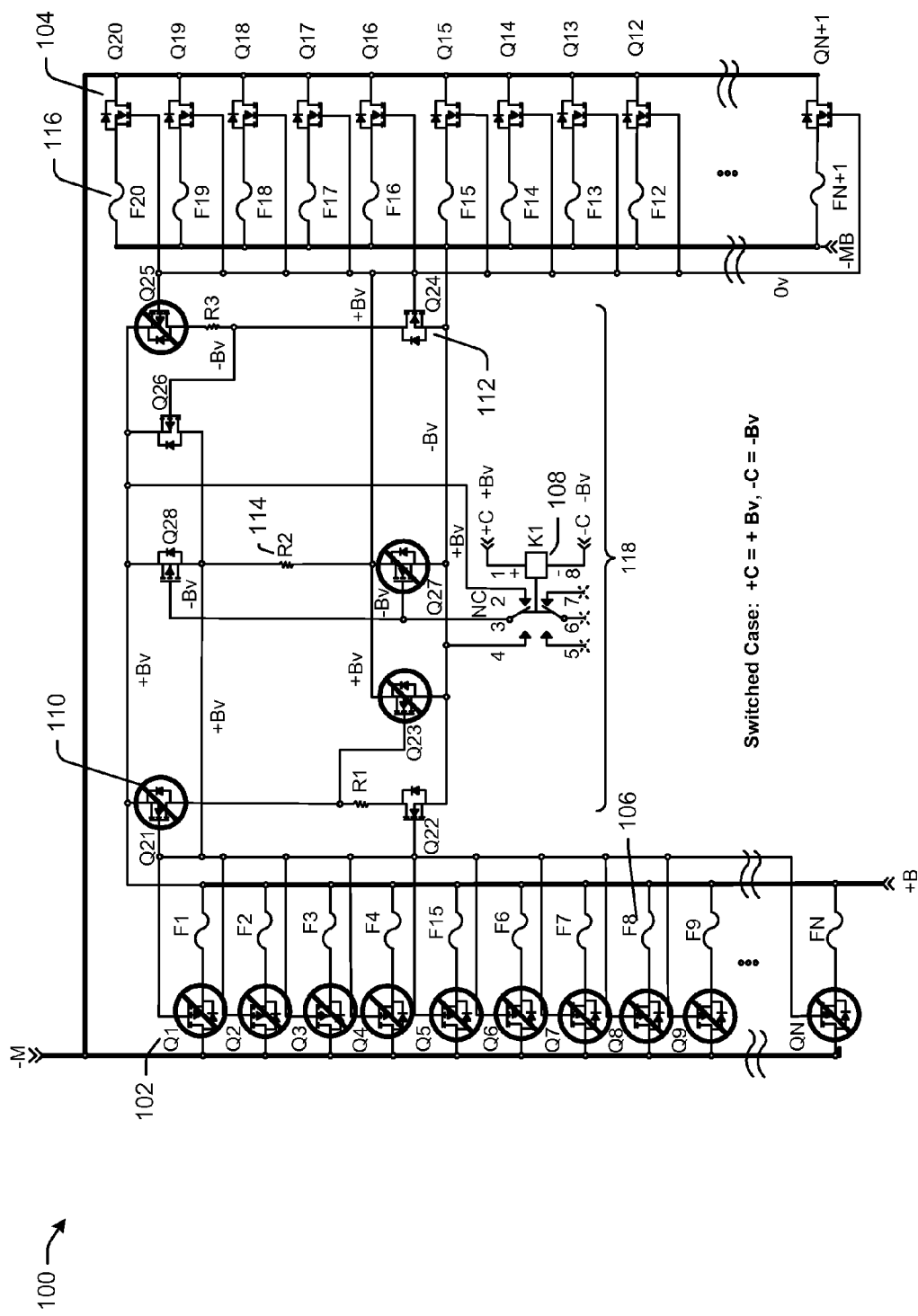
FIG. 3 is a schematic of a solid state semiconductor circuit according to one or more example embodiments.

FIG. 3 illustrates a switched state of the solid state semiconductor circuit or FET bypass module 100, according to one or more example embodiments. As illustrated in the figure, the control module 118 receives a bypass voltage By from the control signal processing interface, and so the normally closed (NC) P-Channel MOSFETs 102 may be switched to an open mode, thereby blocking any current to pass through, and the normally open (NO) N-Channel MOSFETs 104 may be switched to a closed mode, thereby allowing current to pass through. In this switched state, the control module 118, which comprises the primary drivers of gate voltages (Q21-Q28), may receive the bypass voltage By from the relay K1 and so the N-Channel logic level enhancement mode FETs (Q22, Q24) and the P-Channel logic level enhancement mode FETs (Q26, Q28) may be switched to a closed mode, thereby allowing current to pass through, and the N-Channel logic level enhancement mode FETs (Q23, Q27) and the P-Channel logic level enhancement mode FETs (Q21, Q25) may be switched to an open mode, thereby blocking any current to pass through.

The above solid state semiconductor circuit allows for precise control of electrical transfer of power through or around power sources. The switching mechanism of the solid state semiconductor circuit or FET bypass module 100 enhances reliability by providing additional protection against shorting. Moreover, the above solid state semiconductor circuit allows for power override switching that allows the bypass or connection of multiple sources without shorting the two (or more) sources together while switching.

As illustrated in FIGS. 1-3, in some embodiments, the solid state semiconductor circuit or FET bypass module 100 may allow for granular module bypassing which provides the ability to disable a bad subcomponent of the solid state semiconductor circuit by including a fuse to disrupt module shorting due to an internally short circuited MOSFET. As a result, the above structure may allow the remaining MOSFETS to operate normally thereby providing continued bypass functionality.

Figure 4:
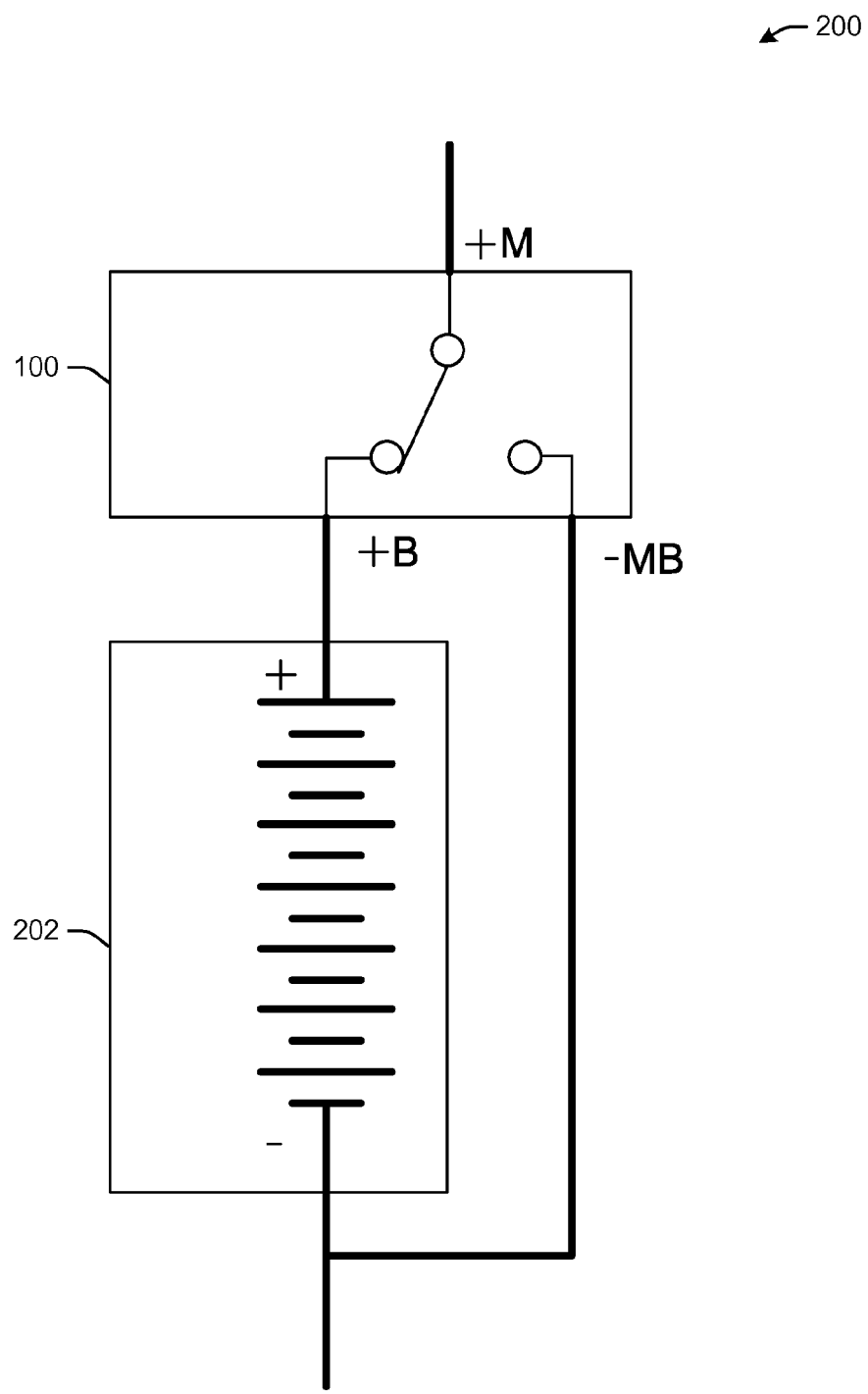
FIG. 4 is a schematic of a system according to one or more example embodiments.

Turning now to FIG. 4, FIG. 4 illustrates an example implementation of the solid state semiconductor circuit or FET bypass module 100 in a system 200, according to one or more example embodiments. System 200 may be a battery pack or a load management system. System 200 may include a battery including an anode material, a cathode material, and an electrolyte material, which may serve as a power source 202, for example, or if the system 200 serves as a load management system, then the load management system may include a load or power source 202, for example. As shown in FIG. 4, for example, the MOSFET gate voltage may be taken directly from the source module being bypassed, allowing a true normally-closed contact in the off-state to dissipate no power for gate drive. In such instances, the drive voltage may be derived from nodes '+B' and '−MB,' which must be less than the rated MOSFET gate voltage, for example.

Figure 5:
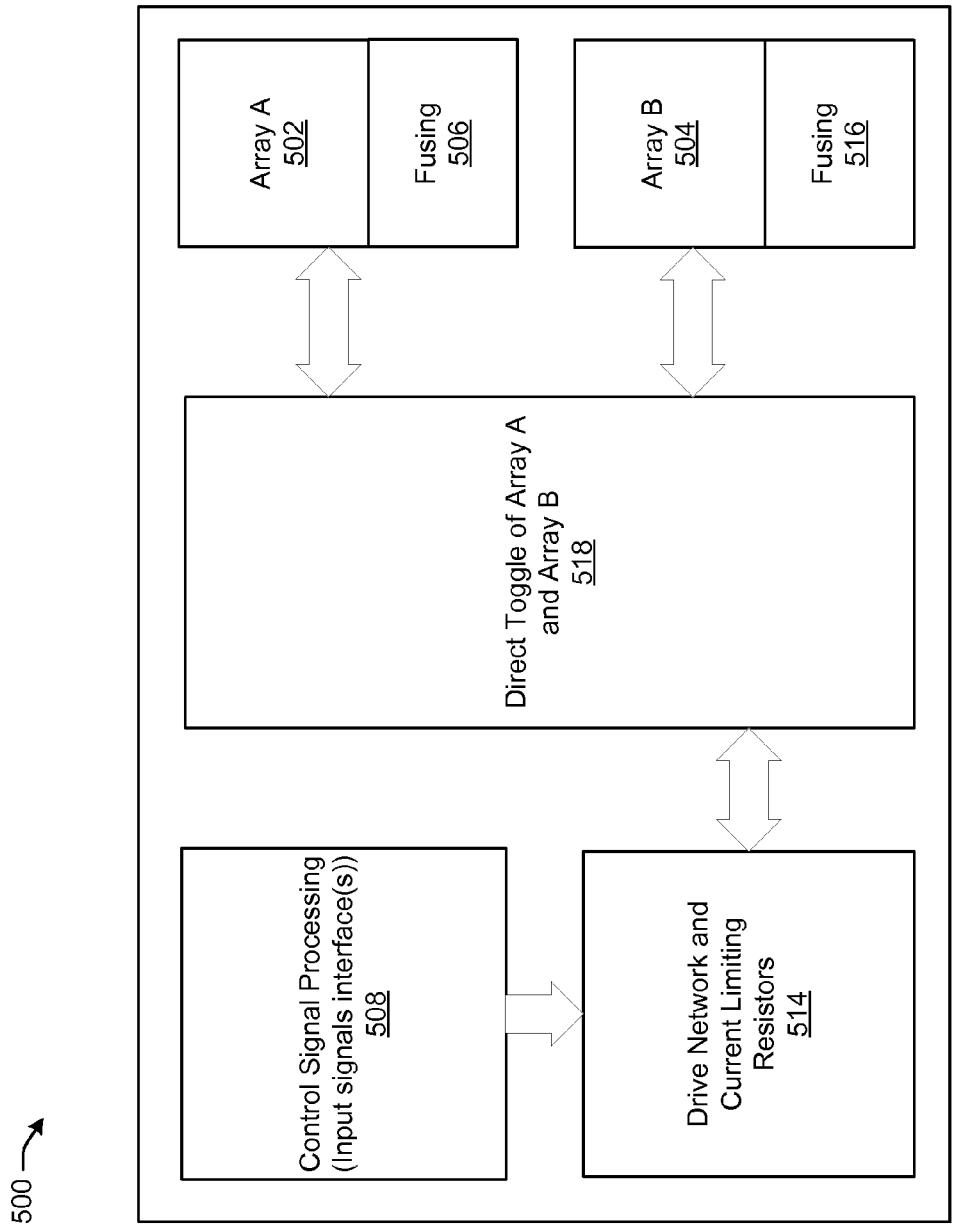
FIG. 5 is a function diagram of a solid state semiconductor circuit according to one or more example embodiments.

FIG. 5 illustrates, for example, a system function or block diagram of a system 500 including the solid state semiconductor circuit or FET bypass module, according to one or more example embodiments. System 500 may include one or more control signals processing or input signals interfaces 508, which may be a microcontroller or a microprocessor or may be implemented as software or firmware, for example. Control signals from the control signals interfaces may be sent to the drive network and current limiting resistors 514, which may include one or more N-Channel logic level enhancement mode FETs (Q22, Q23, Q24, Q27) and one or more P-Channel logic level enhancement mode FETs or switch resisters (Q21, Q25, Q26, Q28) to toggle between the P-Channel MOSFET array (Array A) and the N-Channel MOSFET array (Array B), and one or more resistors (R1, R2, R3) to limit a current entering or exiting the one or more N-Channel logic level enhancement mode FETs or the one or more P-Channel logic level enhancement mode FETs, for example. System 500 may also include a direct toggle 518 of Array A and Array B which may enable switching between the two arrays, for example. Each of the plurality of P-Channel MOSFETs in Array A 502 and the plurality of N-Channel MOSFETs in Array B may be connected in series to one or more fuses 506, 516, respectively, to which the load or source may attach. The fuses may be 15 A or any size suitable for the purpose, for example.

Figure 6:
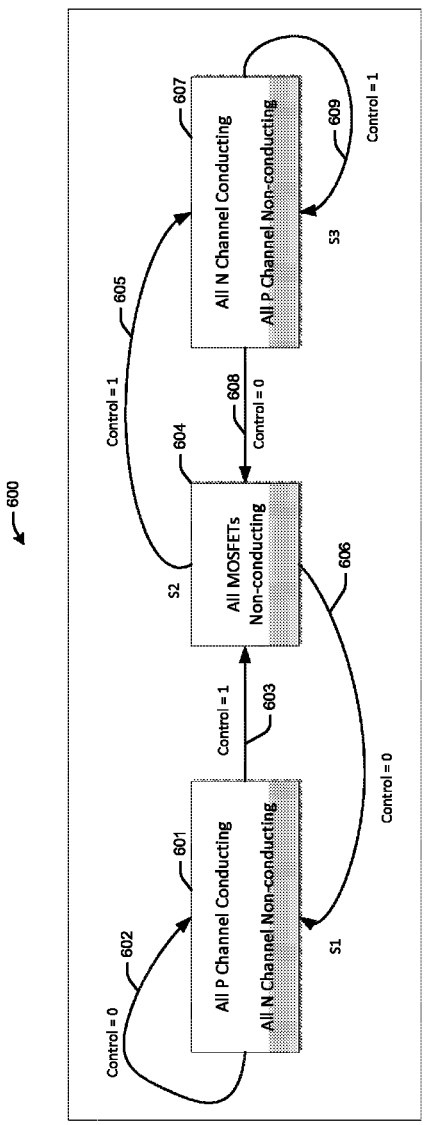
FIG. 6 is a flowchart showing example operations in a FET array bypass module according to one or more example embodiments.

FIG. 6 is a graphic illustration of a method 600 for switching current in a device, according to one or more example embodiments. As illustrated in FIG. 6, at step 601, all P-Channel MOSFETs are conducting and all N-Channel MOSFETs are non-conducting in state S1. If the control signal received by the FET bypass module is a '0' in step 602, then all P-Channel MOSFETs remain conducting and all N-Channel MOSFETs remain non-conducting. However, if the control signal is a '1' as in step 603, then the device transitions into state S2 where all MOSFETs, P-Channel and N-Channel, are non-conducting or blocking as indicated in step 604. At this point, if the FET bypass module receives a control signal that is a '0' as in step 606, then the device returns to state S1 where all P-Channel MOSFETs are conducting and all N-Channel MOSFETs are non-conducting. However, if the control signal is a '1' as in step 605, then the device transitions into state S3 where all N-Channel MOSFETs are conducting and all P-Channel MOSFETs are non-conducting or blocking as indicated in step 607. In this state, if the device receives a control signal that is a '1' as in step 609, then all N-Channel MOSFETs continue to conduct and all P-Channel MOSFETs continue to be non-conducting or blocking as indicated in step 607. However, if the control signal is a '0' as indicated in step 608, then the device transitions back to state S2 or step 604. In other words, if the control signal is cleared to 0, the reverse process occurs. The bypass module briefly transitions to state S2 before returning to the normal operating state S1. Additional circuitry provides the transition state S2 by delaying the closing of one MOSFET array until after the opposing MOSFET array has fully opened. The MOSFET body diodes can carry current during this state so that current through the common terminal is uninterrupted, but these diodes are oriented such that they will not short the bypass module. Current direction may determine whether P-Channel MOSFET or N-Channel MOSFET body diodes conduct. If the control signal changes during the brief transition state S2, the bypass module returns to the previous state. This three state switching provides a brief intermediary time when neither normally-closed nor normally-open switches conduct in a way that can short the module. It should be noted, however, that in some embodiments, the control signal may be set to 1 when there is no need to switch the loads and may be set to 0 when the relay is triggered and/or switched. Moreover, voltage and current may be used as inputs to operate logic and drive the MOSFET gates, for example.

The above disclosed embodiments reduce the requirement for testing and maintenance during the lifetime of the system by eliminating the electro-mechanical contactors typically used in the industry. In some embodiments, the solid state semiconductor circuit may be scalable to a plurality of source or load switching applications.

Exemplary embodiments disclosed may be used as a battery bypass for charge, discharge, and charge limiting control for various types of cells, batteries, and/or chemistries. The exemplary embodiments may also be used as a bypass module for power override switching that may allow the bypass or connection of multiple loads without shorting two or more together while switching.

Various principles of the disclosure have been described in illustrative embodiments. However, many combinations and modifications of the above-described formulations, proportions, elements, materials, and components used in the practice of the disclosure, in addition to those not specifically described, may be varied and particularly adapted to specific environments and operating requirements without departing from those principles. Other variations and modifications of the example embodiments will be apparent to those of ordinary skill in the art, and it is the intent that such variations and modifications be covered by this disclosure. For example, the terms "high", "medium", and "low" as referred to with respect to current, voltage, or power in the embodiments described above are purely exemplary. Accordingly, the principles underlying the example embodiments disclosed herein may be applied to any size battery or load management system, for example.

When introducing elements of some embodiments(s), the articles "a", "an", "the" and "said" are intended to mean that there are one or more of the elements. The terms "comprising", "including" and "having" are intended to be inclusive and mean that there may be additional elements other than the listed elements.

As various changes could be made in the above materials and methods without departing from the scope of the disclosure, it is intended that all matter contained in the above description and shown in the accompanying figures shall be interpreted as illustrative and not in a limiting sense.

EXAMPLES

The following non-limiting examples set forth below are illustrative of various aspects of certain exemplary embodiments. The compositions, methods and various parameters reflected therein are intended only to exemplify various aspects and embodiments of the disclosure, and are not intended to limit the scope of the claims.

One example is a bypass module including a plurality of P-Channel MOSFETs connected in parallel to form a P-Channel MOSFET array, a plurality of N-Channel MOSFETs connected in parallel to form a N-Channel MOSFET array, and a control module to control switching of the P-Channel MOSFET array and the N-Channel MOSFET array. The plurality of P-Channel MOSFETs may function as normally closed (NC) switches, and the plurality of N-Channel MOSFETs may function as normally open (NO) switches. The control module includes one or more N-Channel logic level enhancement mode FETs and one or more P-Channel logic level enhancement mode FETs to toggle between the P-Channel MOSFET array and the N-Channel MOSFET array. The control module receives one or more control signals from a control signals interface to control switching of the P-Channel MOSFET array and the N-Channel MOSFET array so both arrays do not conduct at the same time. The plurality of P-Channel MOSFETs and the plurality of N-Channel MOSFETs may be each connected in series to a fuse to which a load or source may attach. The control module further includes one or more resistors to limit a current entering or exiting the one or more N-Channel logic level enhancement mode FETs or the one or more P-Channel logic level enhancement mode FETs. The bypass module may also include a relay switch to provide a power signal to the bypass module.

Another example is a battery pack including a battery, and a bypass module powered by the battery, the bypass module including a plurality of P-Channel MOSFETs connected in parallel to form a P-Channel MOSFET array, a plurality of N-Channel MOSFETs connected in parallel to form a N-Channel MOSFET array, and a control module to control switching of the P-Channel MOSFET array and the N-Channel MOSFET array. The battery may include an anode material, a cathode material, and an electrolyte material, for example. The plurality of P-Channel MOSFETs may function as normally closed (NC) switches, and the plurality of N-Channel MOSFETs may function as normally open (NO) switches. The control module includes one or more N-Channel logic level enhancement mode FETs and one or more P-Channel logic level enhancement mode FETs to toggle between the P-Channel MOSFET array and the N-Channel MOSFET array. The control module receives one or more control signals from a control signals interface to control switching of the P-Channel MOSFET array and the N-Channel MOSFET array so both arrays do not conduct at the same time. The plurality of P-Channel MOSFETs and the plurality of N-Channel MOSFETs may be each connected in series to a fuse to which a load or source may attach. The control module further includes one or more resistors to limit a current entering or exiting the one or more N-Channel logic level enhancement mode FETs or the one or more P-Channel logic level enhancement mode FETs. The bypass module may also include a relay switch to provide a power signal to the bypass module.

Another example is a load management system including a power source or a load, and a bypass module powered by the load, the bypass module including a plurality of P-Channel MOSFETs connected in parallel to form a P-Channel MOSFET array, a plurality of N-Channel MOSFETs connected in parallel to form a N-Channel MOSFET array, and a control module to control switching of the P-Channel MOSFET array and the N-Channel MOSFET array. The plurality of P-Channel MOSFETs may function as normally closed (NC) switches, and the plurality of N-Channel MOSFETs may function as normally open (NO) switches. The control module includes one or more N-Channel logic level enhancement mode FETs and one or more P-Channel logic level enhancement mode FETs to toggle between the P-Channel MOSFET array and the N-Channel MOSFET array. The control module receives one or more control signals from a control signals interface to control switching of the P-Channel MOSFET array and the N-Channel MOSFET array so both arrays do not conduct at the same time. The plurality of P-Channel MOSFETs and the plurality of N-Channel MOSFETs may be each connected in series to a fuse to which a load or source may attach. The control module further includes one or more resistors to limit a current entering or exiting the one or more N-Channel logic level enhancement mode FETs or the one or more P-Channel logic level enhancement mode FETs. The bypass module may also include a relay switch to provide a power signal to the bypass module.

Another example is a method for switching current in a device, the method including connecting in parallel a plurality of P-Channel MOSFETs to form a P-Channel MOSFET array, connecting in parallel a plurality of N-Channel MOSFETs to form a N-Channel MOSFET array, receiving, by a control module, one or more control signals to control switching of the P-Channel MOSFET array and the N-Channel MOSFET array. The plurality of P-Channel MOSFETs may function as normally closed (NC) switches, and the plurality of N-Channel MOSFETs may function as normally open (NO) switches. The method may include receiving, by the control module, a first control signal, switching, by the control module, based at least in part on the first control signal, the normally closed (NC) P-Channel MOSFETs to open mode, switching, by the control module, based at least in part on the first control signal, the normally open (NO) N-Channel MOSFETs to closed mode. The method may also include waiting, by the control module, for the normally closed (NC) P-Channel MOSFETs to reach an open threshold before switching the normally open (NO) N-Channel MOSFETs to closed mode. The method may also include receiving, by the control module, a second control signal, switching, by the control module, based at least in part on the second control signal, the normally open (NO) N-Channel MOSFETs to open mode, switching, by the control module, based at least in part on the second control signal, the normally closed (NC) P-Channel MOSFETs to closed mode. The method for switching current in the device may a break-before-make or non-shorting method. The control module includes one or more N-Channel logic level enhancement mode FETs and one or more P-Channel logic level enhancement mode FETs to toggle between the P-Channel MOSFET array and the N-Channel MOSFET array. The control module receives the one or more control signals from a control signals interface to control switching of the P-Channel MOSFET array and the N-Channel MOSFET array so both arrays do not conduct at the same time. The plurality of P-Channel MOSFETs and the plurality of N-Channel MOSFETs may be each connected in series to a fuse to which a load or source may attach. The control module further includes one or more resistors to limit a current entering or exiting the one or more N-Channel logic level enhancement mode FETs or the one or more P-Channel logic level enhancement mode FETs. The method may also include providing a power signal to the control module by a relay switch.

Another example is a system including a plurality of P-Channel MOSFETs connected in parallel to form a P-Channel MOSFET array, a plurality of N-Channel MOSFETs connected in parallel to form a N-Channel MOSFET array, and a means to control switching of the P-Channel MOSFET array and the N-Channel MOSFET array so both arrays do not conduct at the same time.

What is claimed is:

1. A bypass module comprising:
  a plurality of P-Channel MOSFETs connected in parallel to form a P-Channel MOSFET array having a first finite transition period;
  a plurality of N-Channel MOSFETs connected in parallel to form a N-Channel MOSFET array having a second finite transition period;
  wherein the P-Channel MOSFET array and the N-Channel MOSFET array form a mutually opposing pair; and
  a control module to control switching of the P-Channel MOSFET array and the N-Channel MOSFET array, wherein the switching for one array of the mutually opposing pair is delayed until the transition period of the other array of the mutually opposing pair is complete.

2. The bypass module according to claim 1, wherein the plurality of P-Channel MOSFETs function as normally closed (NC) switches, and the plurality of N-Channel MOSFETs function as normally open (NO) switches.

3. The bypass module according to claim 1, wherein the control module comprises one or more N-Channel logic level enhancement mode FETs and one or more P-Channel logic level enhancement mode FETs to toggle between the P-Channel MOSFET array and the N-Channel MOSFET array.

4. The bypass module according to claim 3, wherein the control module further comprises one or more resistors to limit a current entering or exiting the one or more N-Channel logic level enhancement mode FETs or the one or more P-Channel logic level enhancement mode FETs.

5. The bypass module according to claim 1, wherein the control module receives one or more control signals from a control signals interface to control switching of the P-Channel MOSFET array and the N-Channel MOSFET array.

6. The bypass module according to claim 1, wherein the plurality of P-Channel MOSFETs and the plurality of N-Channel MOSFETs are each connected in series to a fuse to which a load or source is attached.

7. The bypass module according to claim 1, further comprising a relay switch to provide a power signal to the bypass module.

8. A battery pack comprising:
  the bypass module according to claim 1; and
  a battery that powers the bypass module.

9. A load management system comprising:
  the bypass module according to claim 1; and
  a power source or a load that powers the bypass module.

10. A method for switching current in a device, the method comprising:
  connecting in parallel a plurality of P-Channel MOSFETs to form a P-Channel MOSFET array having a first finite transition period;
  connecting in parallel a plurality of N-Channel MOSFETs to form a N-Channel MOSFET array having a second finite transition period;
  wherein the P-Channel MOSFET array and the N-Channel MOSFET array form a mutually opposing pair; and
  receiving, by a control module, one or more control signals to control switching of the P-Channel MOSFET array and the N-Channel MOSFET array, wherein the switching for one array of the mutually opposing pair is delayed until the transition period of the other array of the mutually opposing pair is complete.

11. The method according to claim 10, wherein the plurality of P-Channel MOSFETs function as normally closed (NC) switches, and the plurality of N-Channel MOSFETs function as normally open (NO) switches.

12. The method according to claim 11, further comprising:
  receiving, by the control module, a first control signal;
  switching, by the control module, based at least in part on the first control signal, the normally closed (NC) switches to open mode;
  switching, by the control module, based at least in part on the first control signal, the normally open (NO) switches to closed mode.

13. The method according to claim 12, further comprising:
  waiting, by the control module, for the normally closed (NC) switches to reach an open threshold before switching the normally open (NO) switches to closed mode.

14. The method according to claim 12, further comprising:
  receiving, by the control module, a second control signal;
  switching, by the control module, based at least in part on the second control signal, the normally open (NO) switches to open mode;

switching, by the control module, based at least in part on the second control signal, the normally closed (NC) switches to closed mode.

15. The method according to claim 12, wherein the control module further comprises one or more resistors to limit a current entering or exiting the one or more N-Channel logic level enhancement mode FETs or the one or more P-Channel logic level enhancement mode FETs.

16. The method according to claim 10, wherein the control module comprises one or more N-Channel logic level enhancement mode FETs and one or more P-Channel logic level enhancement mode FETs to toggle between the P-Channel MOSFET array and the N-Channel MOSFET array.

17. The method according to claim 10, wherein the control module receives the one or more control signals from a control signals interface to control switching of the P-Channel MOSFET array and the N-Channel MOSFET array.

18. The method according to claim 10, wherein the plurality of P-Channel MOSFETs and the plurality of N-Channel MOSFETs are each connected in series to a fuse to which a load or source is attached.

19. The method according to claim 10, further comprising:
providing a power signal to the control module by a relay switch.

20. A system comprising:
a plurality of P-Channel MOSFETs connected in parallel to form a P-Channel MOSFET array having a first finite transition period;
a plurality of N-Channel MOSFETs connected in parallel to form a N-Channel MOSFET array having a second finite transition period;
wherein the P-Channel MOSFET array and the N-Channel MOSFET array form a mutually opposing pair; and
a means to control switching of the P-Channel MOSFET array and the N-Channel MOSFET array, wherein the switching for one array of the mutually opposing pair is delayed until the transition period of the other array of the mutually opposing pair is complete.

\* \* \* \* \*